United States Patent [19]
Jeddeloh

[11] Patent Number: 5,889,726
[45] Date of Patent: Mar. 30, 1999

[54] APPARATUS FOR PROVIDING ADDITIONAL LATENCY FOR SYNCHRONOUSLY ACCESSED MEMORY

[75] Inventor: Joseph M. Jeddeloh, Minneapolis, Minn.

[73] Assignee: Micron Electronics, Inc., Nampa, Id.

[21] Appl. No.: 971,743

[22] Filed: Nov. 17, 1997

[51] Int. Cl.$^6$ ....................................................... G11C 8/00
[52] U.S. Cl. .................. 365/233; 365/189.12; 365/194; 365/239
[58] Field of Search .................................... 365/233, 194, 365/189.02, 189.12, 239

[56] References Cited

U.S. PATENT DOCUMENTS

| | | | |
|---|---|---|---|
| 5,224,072 | 6/1993 | Matsubara | 365/194 |
| 5,440,515 | 8/1995 | Chang et al. | 365/189.12 |
| 5,530,670 | 6/1996 | Matsumoto | 365/189.12 |
| 5,701,436 | 12/1997 | Nagashima et al. | 365/189.12 |
| 5,767,715 | 6/1998 | Marquis et al. | 365/233 |

*Primary Examiner*—Son T. Dinh
*Attorney, Agent, or Firm*—Park & Vaughan

[57] ABSTRACT

One embodiment of the present invention provides a memory system that allows more than one cycle of memory latency for accesses to a synchronously accessed memory. In this embodiment, the memory system includes a memory with a clocked interface and a corresponding clock input. It also includes an output register for storing data outputted from the memory during a read operation. The output register and the memory are coupled together by a data path, for transferring data between the memory and the output register. In this embodiment, the memory system further includes a clock signal coupled to the clocked interface of the memory. The clock signal feeds through a delay element into a clock input of the output register. This causes the output register to receive a delayed clock signal, thereby providing more than one clock cycle of time for data to be read from the memory and latched in the output register. In another embodiment, the present invention provides an input register, for inputting data during write operations. This input register similarly receives a delayed clock signal, which functions as an advanced clock signal from the preceding clock cycle to provide more than one clock cycle of latency for write accesses to memory.

10 Claims, 4 Drawing Sheets

APPARATUS FOR PROVIDING ADDITIONAL LATENCY FOR SYNCHRONOUSLY ACCESSED MEMORY

RELATED APPLICATION

This application hereby incorporates by reference the following related non-provisional application by the same inventors as the instant application, and filed on the same day as the instant application: "Method for Providing Additional Latency for Synchronously Accessed Memory," having Ser. No. 08/971,834.

BACKGROUND

1. Field of the Invention

The present invention relates to memory systems for computers, and more particularly to the design of a memory system that provides variable memory latency for read and/or write accesses to a synchronously accessed memory.

2. Related Art

New memory system designs have been developed to keep pace with rapid increases in processor clock speeds. As processors get faster, memory systems are under increasing pressure to provide data at faster rates to keep up with the processors. This has recently led to the development of new memory system designs. Latencies for memory accesses have been dramatically decreased by using page mode and extended data out (EDO) memory designs, which achieve a high burst rate and low latencies within a single page of memory. Another recent innovation is to incorporate a synchronous clocked interface into a memory chip, thereby allowing data from within the same page of memory to be clocked out of the memory in a continuous stream using the processor clock. Such memory chips, with clocked interfaces are known as synchronous random access memories.

Recently, standards such as Rambus and SyncLink have been developed to govern the transfer of data between memory and processor using such clocked interfaces. SyncLink, which will be known as IEEE Standard 1596.7, specifies an architecture that supports a 64M-bit memory with a data transfer rate of 1.6 gigabytes per second. SyncLink packetizes and pipelines the address, commands, and timing, and adds features that significantly increase the data bus speed, thereby providing fast memory access without losing the ability to move quickly from row to row or to obtain bursts of data. In the IEEE standard, a 10-bit upper bus is used for command and address transmission, and an 18-bit lower bus is used for data signals.

As processor clock speeds continue to increase, it is becoming increasing harder for memories with clocked interfaces to keep pace with processor clock speeds. More than one clock cycle of time may be required to read from or write to a synchronous memory. Furthermore, the amount of time required access a memory may depend upon the latency of a particular memory chip, and this latency can vary as different memory chips are included in a memory system. This makes it hard to design a memory architecture that can flexibly accommodate different memory chips.

What is needed is a memory system including a synchronous interface between processor and memory that provides more than one clock cycle of time for read and/or write accesses to the memory.

Additionally, what is needed is a memory system that provides a configurable latency for read and write accesses to a synchronously accessed memory in order to allow the memory system to operate with different memory devices and/or different processor clock speeds.

SUMMARY

One embodiment of the present invention provides a memory system that allows more than one cycle of memory latency for accesses to a synchronously accessed memory. In this embodiment, the memory system includes a memory with a clocked interface and a corresponding clock input. It also includes an output register for storing data outputted from the memory during a read operation. The output register and the memory are coupled together by a data path, for transferring data between the memory and the output register. In this embodiment, the memory system further includes a clock signal coupled to the clocked interface of the memory. The clock signal feeds through a delay element into a clock input of the output register. This causes the output register to receive a delayed clock signal, thereby providing more than one clock cycle of time for data to be read from the memory and latched in the output register. In another embodiment, the present invention provides an input register, for inputting data during write operations. This input register similarly receives a delayed clock signal, which functions as an advanced clock signal from the preceding clock cycle to provide more than one clock cycle of latency for write accesses to memory.

In one embodiment of the present invention, the delay element may include a variable delay, which can be selectively configured to produce different delays to flexibly accommodate different memory latencies and processor speeds.

In another embodiment, the memory may include a plurality of memory modules.

Yet another embodiment of the present invention provides a memory controller that allows for more than one clock cycle of memory latency for accesses to a memory. In this embodiment, the memory controller includes: a processor interface, for coupling to a processor; an input register including a clock input, for storing data to be inputted into the memory during a write operation; and an output register including a clock input, for storing data outputted from the memory during a read operation. The memory controller may also include a data path coupled between the processor interface and the input and output registers, for transferring data between the processor interface and the input and output registers. The memory controller may additionally include a controller coupled to the processor interface, the input register and the output register, for controlling the transfer of data between a processor coupled to the processor interface and a memory coupled to the input and output registers. This controller may include a first delay element, with an input coupled to a clock signal, and an output coupled to the output register, so that the output register receives a delayed clock signal.

In another embodiment, the controller may include a second delay element, including an input coupled to the clock signal, and an output coupled to the output register, so that the output register receives a delayed clock signal.

In another embodiment, the first delay element may include a variable delay, which can be selectively configured to produce different delays.

In yet another embodiment, the memory controller may include a control interface coupled to the controller for providing control signals to the memory.

DETAILED DESCRIPTION OF THE INVENTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Description of Computer System and Memory Subsystem

Figure 1:
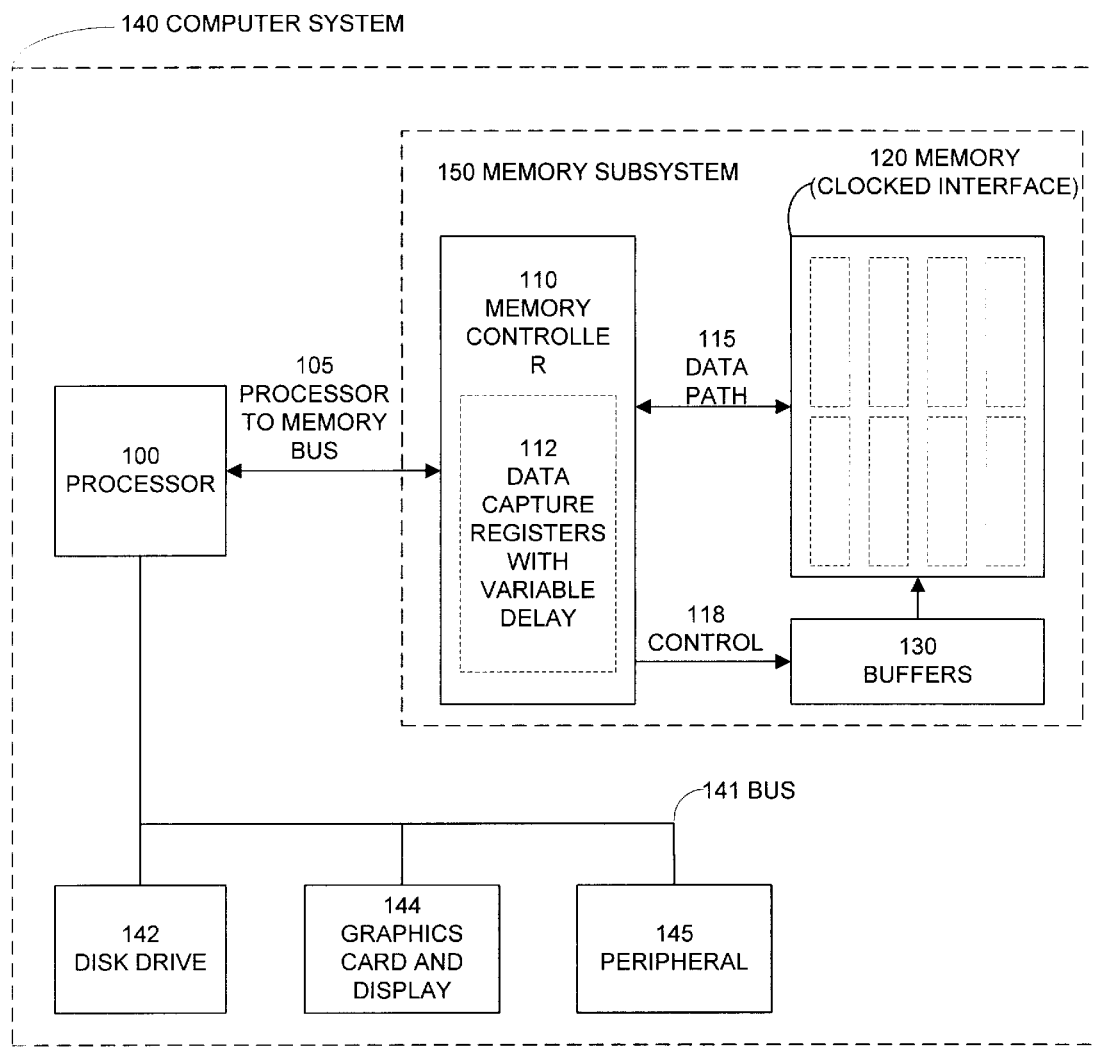
FIG. 1 is a block diagram illustrating some of the major functional components of a computer system 140 including a memory subsystem 150 in accordance with an embodiment of the present invention.

FIG. 1 is a block diagram illustrating some of the major functional components of a computer system 140 including a memory subsystem 150 in accordance with an embodiment of the present invention. FIG. 1 illustrates a computer system 140, including a memory subsystem 150, which is coupled to processor 100 through a processor-to-memory bus 150. Processor 100 is additionally coupled with disk drive 142, graphics card and display 144 and peripheral device 145 through bus 141. Processor 100 may be any general or special purpose processor, including, but not limited to microprocessors, mainframe computers, digital signal processors, graphics processors and device controllers. Bus 141 may be any type of communication channel for coupling a processor to other devices in a computer system, including peripheral devices, memory devices and other processors. This includes, but is not limited to, buses such as the PCI bus. Disk drive 142 may be any type of non-volatile storage device. This includes, but is not limited to, magnetic, optical, magneto-optical and flash memory devices. Graphics card and display 144 includes a graphics card that is coupled with bus 141 and a display for outputting graphical images processed by the graphics card. Peripheral device 145 may be any type of peripheral device that can be coupled to a computer system. This includes, but is not limited to: a data storage device, such as a disk drive or a tape drive; a data input device, such as a keyboard or a mouse; a data output device, such as a video display or an audio speaker; and a communication device, such as a network interface controller.

Processor 100 is coupled through processor-to-memory bus 105 to memory controller 110 within memory subsystem 150. Processor-to-memory bus 105 includes any type of channel that can be used to connect processor 100 with memory 120. Memory controller 110 coordinates accesses by processor 100 to memory 120. In the illustrated embodiment, memory controller 110 includes data capture registers with variable delay 112. Data capture registers 112 may be used to buffer data to be read from and written to memory 120.

Memory controller 110 is coupled through data path 115 to memory 120. Data path 115 is any channel capable of carrying data between memory controller 110 and memory 120. Memory 120 is any type of memory with a clocked interface for moving data onto and off of the memory, this includes but is not limited to: synchronous random access memory, memory with a Rambus interface, and memory with a SyncLink interface. Any other memory that provides for clocked data transfers onto and off of a memory chip can be used as memory 120. As shown in FIG. 1, memory 120 includes a plurality of memory chips. Thus, each line in data path 115 may have to drive inputs of a plurality of memory chips. This drive requirement may increase the latency for memory transfers.

Memory controller 110 additionally produces control signals 118, for controlling memory chips within memory 120. In one embodiment, control signals 118 feed through buffers 130, which act to increase the drive strength of control signals 118, before control signals 118 feed into memory 120. In this embodiment, increasing the drive strength of control signals 118, allows control signals 118 to more rapidly activate chips within memory 120.

The memory subsystem 150 illustrated in FIG. 1 operates as follows. During a read operation, processor 100 makes a read request over processor-to-memory bus 105 to memory controller 110. Memory controller 110 receives the read request and activates control signals 118 to command memory 120 to read a data value from a specified address. Memory 120 returns the requested data through its clocked interface to memory controller 110 via data path 115. Memory controller 110 completes the read operation by returning the requested data to processor 100 through processor-to-memory bus 105.

During a write operation, processor 100 feeds the write request and data to be written to memory controller 110. Memory controller 110 receives the write request and activates control signals 118 to command memory 120 to write the data to be written to a specified address. The data to be written is then fed through data path 115 into the specified location in memory 120 through the clocked interface of memory 120.

Description of Memory Controller

Figure 2:
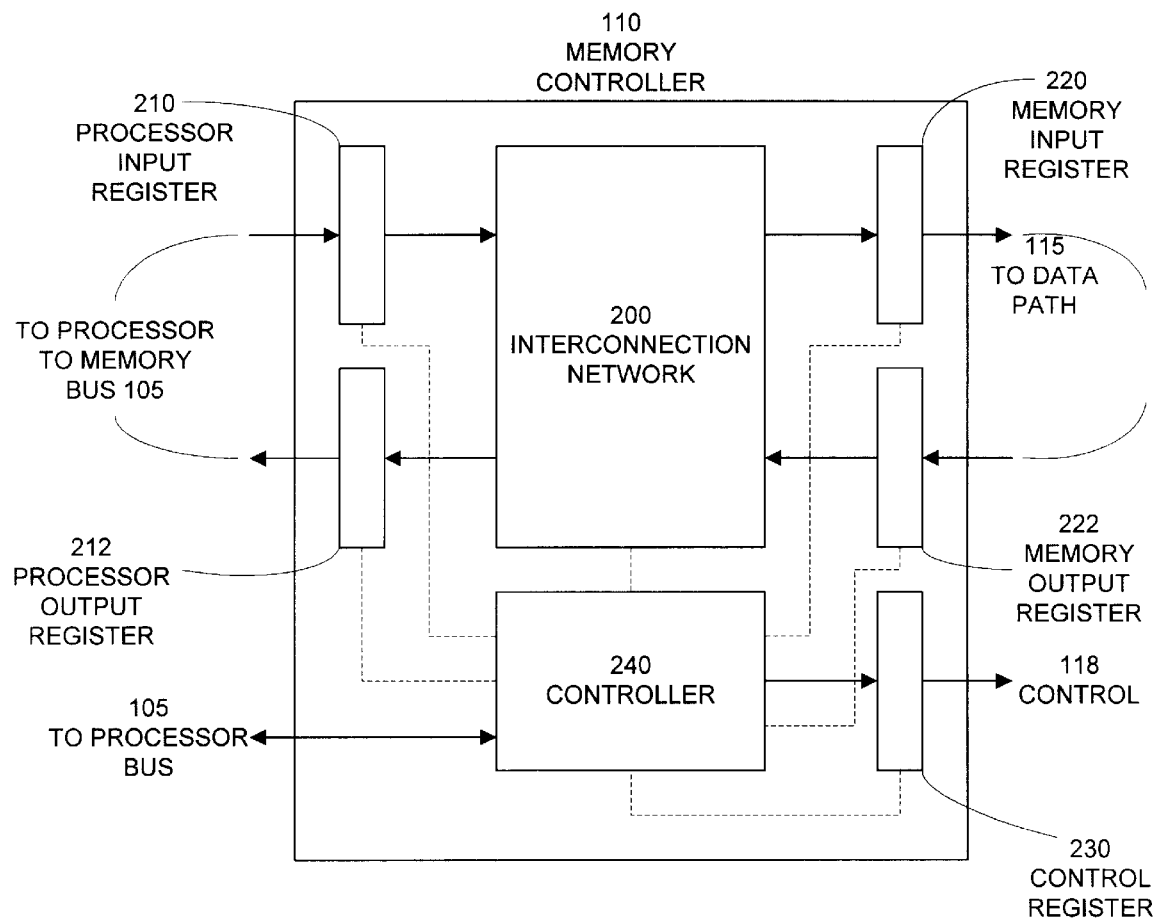
FIG. 2 is a block diagram illustrating some of the major internal functional components of memory controller 110 in accordance with an embodiment of the present invention.

FIG. 2 is a block diagram illustrating some of the major internal functional components of memory controller 110 in accordance with an embodiment of the present invention. As illustrated in FIG. 2, memory controller 110 includes: processor input register 210, processor output register 212, memory input register 220, memory output register 222, control register 230, interconnection network 200 and controller 240.

The above-listed components are connected together as follows. Processor-to-memory bus 105 is coupled to processor input register 210 and processor output register 212. These registers are further coupled to interconnection network 200, which contains switching and queuing circuitry for data to be read from and written to memory 120. Interconnection network 200 is coupled to memory input register 220 and memory output register 222, which are further coupled to data path 115, which is coupled to memory 120.

Controller 240 is coupled to processor input register 210, processor output register 212, interconnection network 200, memory input register 220, and memory output register 222. Controller 240 synchronizes the actions of the above-mentioned components to accomplish memory read and write operations. Memory controller 240 additionally connects to control register 230, the output of which is coupled to control signals 118. Control signals 118 feed into and control memory chips within memory 120. In one embodiment, controller 240 additionally includes an interface to processor 100 through processor-to-memory bus 105. In this embodiment, processor 100 reads status information from controller 240, and writes configuration information to controller 240, including configuration information for setting memory latencies for read and write operations.

The circuitry within memory controller 110 operates as follows. During a read operation, a specified address is fed into interconnection network 200 through processor input register 210. This address feeds through interconnection network 200, and memory input register 220, through which the specified address ultimately reaches memory 120. At the same time, controller 240 applies control signals 118 through control register 230 to chips within memory 120 to accomplish the read operation. Data read from memory 120 is then received at memory output register 222. This data feeds through interconnection network 200 to processor output register 212, and then through processor-to-memory bus 105 to processor 100. The read operation is then complete.

During a write operation, a specified address along with data to be written to the specified address are fed into interconnection network 200 through processor input register 210. The address and data feed through interconnection network 200 into memory input register 220. They then feed across data path 115 to memory 220. At the same time, controller 240 applies control signals 118 through control register 230 to chips within memory 120 to accomplish the write operation. The write operation is then complete.

Description of Delay Circuitry

Figure 3:
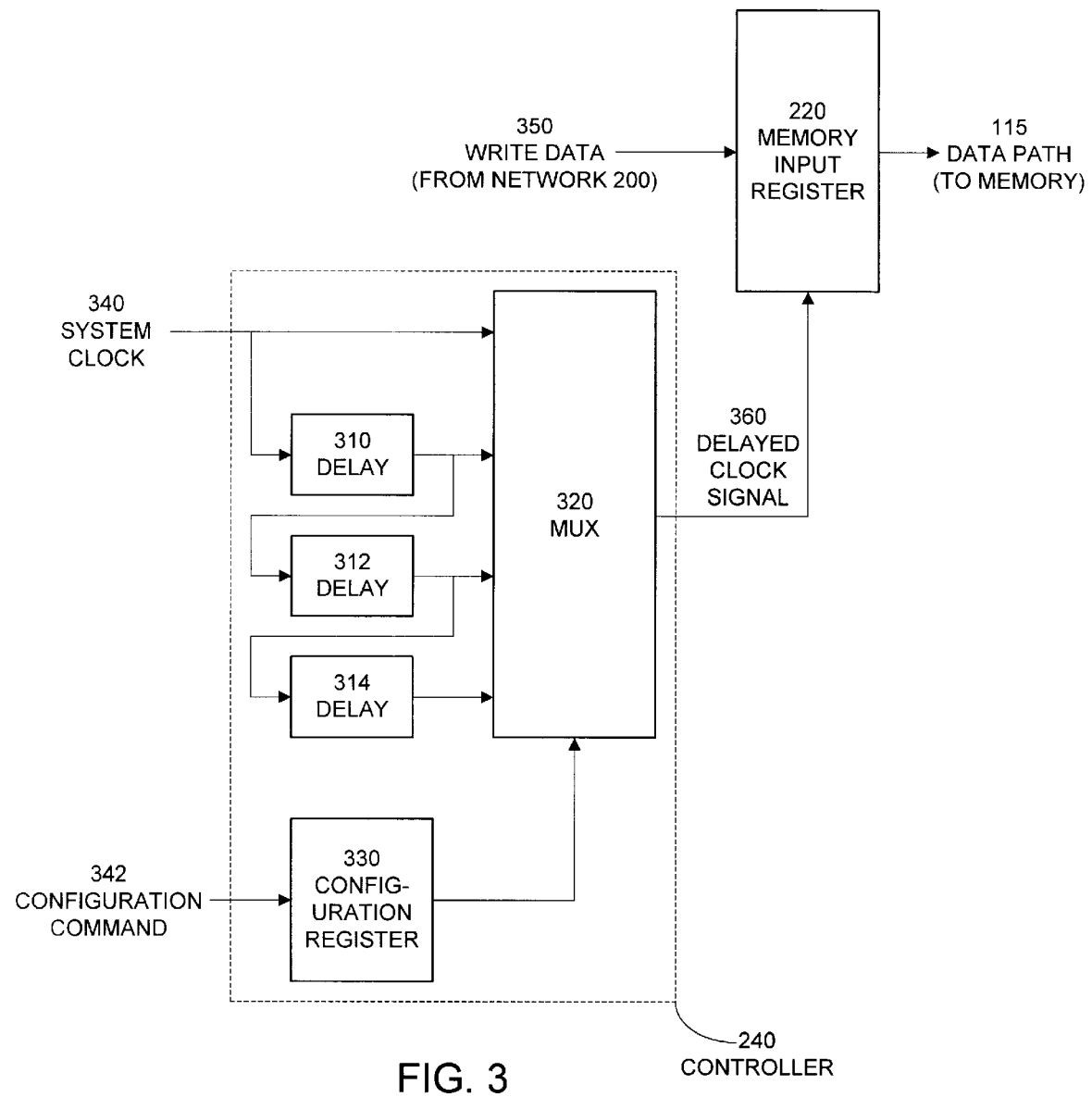
FIG. 3 is a circuit diagram illustrating a circuit that produces a configurable delay for a clock signal 340 during write operations in accordance with an embodiment of the present invention.

FIG. 3 is a diagram illustrating a circuit that produces a configurable delay to memory input register 220 during a write operation in accordance with an embodiment of the present invention. In this embodiment, the configurable delay circuitry primarily resides within controller 240. Controller 240 receives a configuration command 342 from processor 100 through processor-to-memory bus 105. Controller 240 additionally receives system clock signal 340, which it uses to generate delayed clock signal 360. Delayed clock signal 360 feeds into a clock input of memory input register 220. During a write operation, write data 350 from interconnection network 200 is latched into memory input register 220. It then feeds through data path 115 into memory 120, which completes the write operation.

In the illustrated embodiment, controller 240 includes circuitry to produce delayed clock signal 360. This circuitry includes multiplexer (MUX) 320. The data inputs of MUX 320 are coupled to system clock 340, delay element 310, delay element 312, and delay element 314. The select inputs of MUX 320 are coupled to configuration register 330. Configuration register 330 receives a configuration command 342 from processor-to-memory bus 105. The output of MUX 320 is delayed clock signal 360, which feeds into the clock input of memory input register 220. Controller 240 also includes additional circuitry, which is not illustrated.

Delay elements 310, 312 and 314 are chained together. The input of delay element 310 is coupled to system clock 340. The input of delay element 312 is coupled to the output of delay element 310. The input of delay element 314 is coupled to the output of delay element 312. This produces an increasing delay for successive data inputs to MUX 320. The illustrated embodiment includes a four-input multiplexer, which produces four different delays. Another embodiment includes an eight-input multiplexer, which produces eight different delays in one nanosecond increments. Yet another embodiment includes a 16-input multiplexer which produces 16 different delays in 0.5 nanosecond increments.

The embodiment illustrated in FIG. 3 operates as follows. Configuration command 342 feeds into configuration register 330, through which it selects one of the data inputs of MUX 320. The selected input will have a 0, 1, 2, or 3 element delay. Delayed clock signal 360 from the output of MUX 320 feeds into the clock input of memory input register 220. During a write operation, delayed clock signal 360 functions as an early clock signal for the next clock pulse. If write data 350 is available at the input of memory input register 350 early enough, write data 350 is latched into memory input register 220 earlier than the next clock cycle by delayed clock signal 360. This provides more than one clock cycle of latency for data to be written into memory 120 from memory input register 220. By shifting the clocking of memory input register 220, time is effectively stolen from the preceding transition through interconnection network 200, because the write data 350 must arrive early at memory input register 220.

Figure 4:
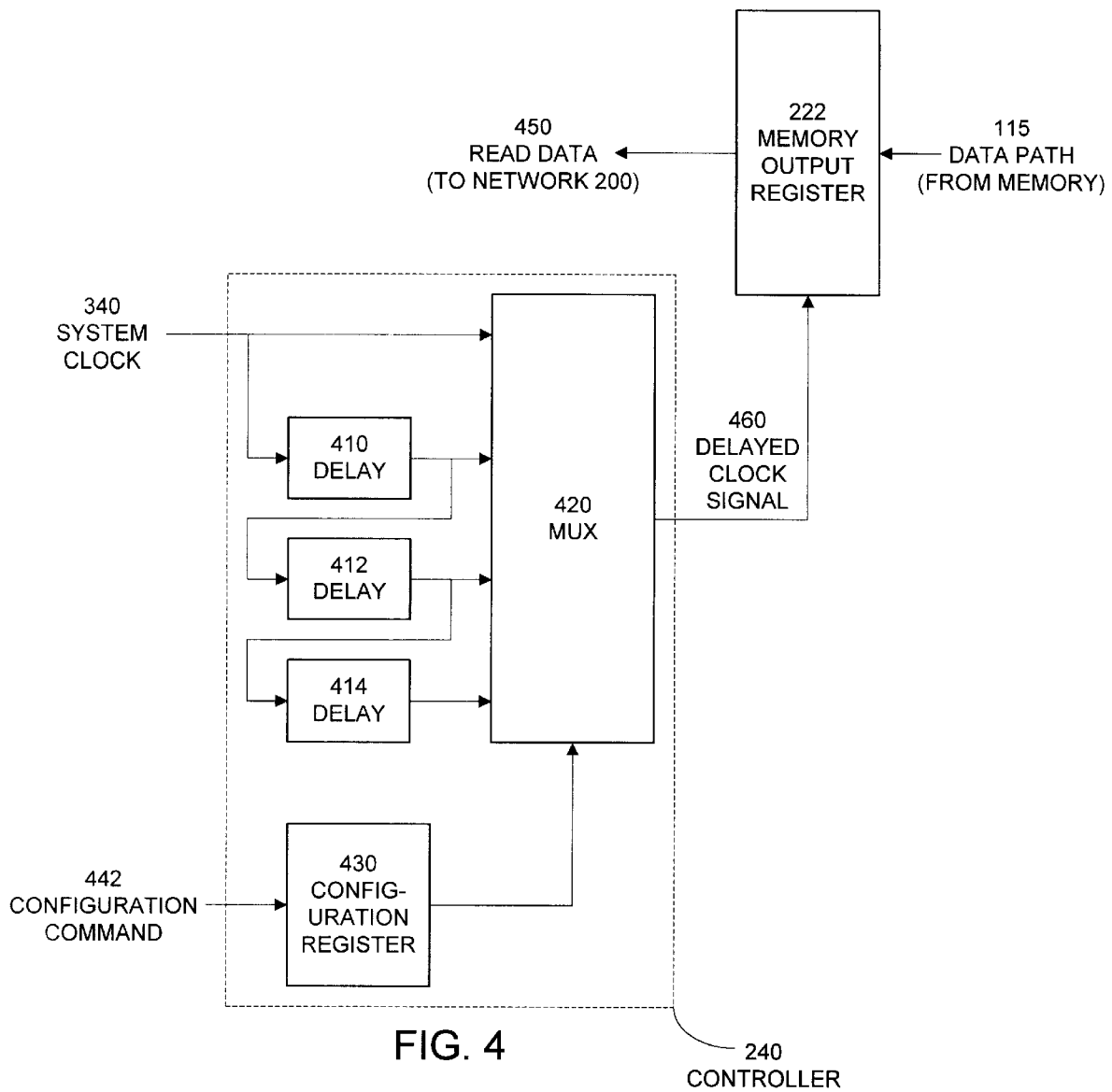
FIG. 4 is a circuit diagram illustrating a circuit that produces a configurable delay for a clock signal 340 during read operations in accordance with an embodiment of the present invention.

FIG. 4 is a circuit diagram illustrating a circuit that produces a configurable delay for a clock signal to memory output register 222 in accordance with an embodiment of the present invention. In this embodiment, the configurable delay circuitry primarily resides within controller 240. Controller 240 receives a configuration command 442 from processor 100 through processor-to-memory bus 105. Controller 240 additionally receives system clock signal 340, which it uses to generate delayed clock signal 460. Delayed clock signal 460 feeds into a clock input of memory output register 222. During a read operation, read data 450 from memory 120 is latched into memory output register 222. It then feeds through interconnection network 200 to processor 100, which completes the read operation.

In the illustrated embodiment, controller 240 includes circuitry to produce delayed clock signal 460 for memory output register 222. This circuitry includes multiplexer (MUX) 420. The data inputs of MUX 420 are coupled to system clock 340, delay element 410, delay element 412, and delay element 414. The select inputs of MUX 420 are coupled to configuration register 430. Configuration register 430 receives a configuration command 442 from processor bus 105. The output of MUX 420 is delayed clock signal 460, which feeds into the clock input of memory output register 222. Controller 240 also includes additional circuitry, which is not illustrated.

Delay elements 410, 412 and 414 are chained together. The input of delay element 410 is coupled to system clock 340. The input of delay element 412 is coupled to the output of delay element 410. The input of delay element 414 is coupled to the output of delay element 412. This produces an increasing delay for successive data inputs to MUX 320. The illustrated embodiment includes a four-input multiplexer, which produces four different delays. Another embodiment includes an eight-input multiplexer, which produces eight different delays in one nanosecond increments. Yet another embodiment includes a 16-input multiplexer which produces 16 different delays in 0.5 nanosecond increments.

The embodiment illustrated in FIG. 4 operates as follows. Configuration command 442 feeds into configuration register 430, through which it selects one of the data inputs of MUX 420. The selected input will have a 0, 1, 2 or 3 element delay. Delayed clock signal 460 from the output of MUX 420 feeds into the clock input of memory output register 222. During a read operation, delayed clock signal 360 provides more than one clock cycle of latency for data to be read from memory 120 into memory output register 222. By shifting the clocking of memory input register 220, time is effectively stolen from the following transition through interconnection network 200, because read data 450 must make the next transition in less than one clock cycle, since it was delayed in being latched into memory output register 222.

The foregoing descriptions of embodiments of the invention have been presented for purposes of illustration and description only. They are not intended to be exhaustive or to limit the invention to the forms disclosed. Obviously, many modifications and variations will be apparent to practitioners skilled in the art.

What is claimed is:

1. A memory controller, that provides more than one clock cycle of memory latency for accesses to a memory with a synchronous interface, comprising:

a processor interface, for coupling to a processor;

an input register including a clock input, for storing data to be inputted into the memory during a write operation;

an output register including a clock input, for storing data outputted from the memory during a read operation;

a data path coupled between the processor interface and the input and output registers, for transferring data between the processor interface and the input and output registers; and a controller coupled to the processor interface, the input register and the output register, for controlling the transfer of data between a processor coupled to the processor interface and a memory coupled to the input and output registers, the controller including a first delay element, with an input coupled to a clock signal, and an output coupled to the clock input of the output register, so that the output register receives a delayed clock signal.

2. The memory controller of claim 1, wherein the controller includes a second delay element, including an input coupled to the clock signal, and an output coupled to the clock input of the output register, so that the output register receives a delayed clock signal.

3. The memory controller of claim 1, wherein the first delay element includes a variable delay, which can be selectively configured to produce different delays.

4. The memory controller of claim 1, wherein the first delay element includes a variable delay, which can be selectively configured by a computer program to produce different delays.

5. The memory controller of claim 1, wherein the delay element includes:

a multiplexer with a plurality of data inputs and a data output; and a plurality of delay elements with differing delays coupled to the plurality of data inputs of the multiplexer, allowing the multiplexer to select between different delay elements with differing delays.

6. The memory controller of claim 1, including a control interface, coupled to the controller for providing control signals to the memory.

7. The memory controller of claim 1, wherein the controller includes circuitry to implement an interface to a synchronous random access memory.

8. The memory controller of claim 1, wherein the controller includes circuitry to implement a Rambus interface.

9. The memory controller of claim 1, wherein the controller includes circuitry to implement a SyncLink interface.

10. The memory controller of claim 1, wherein the memory controller is implemented on an integrated circuit.

\* \* \* \* \*